United States Patent
Seefeldt

(10) Patent No.: US 9,698,743 B2
(45) Date of Patent: Jul. 4, 2017

(54) TIME-VARYING AUDIO-SIGNAL LEVEL USING A TIME-VARYING ESTIMATED PROBABILITY DENSITY OF THE LEVEL

(75) Inventor: Alan Jeffrey Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 2199 days.

(21) Appl. No.: 12/668,789

(22) PCT Filed: Jul. 11, 2008

(86) PCT No.: PCT/US2008/008591
§ 371 (c)(1),
(2), (4) Date: Jan. 12, 2010

(87) PCT Pub. No.: WO2009/011826
PCT Pub. Date: Jan. 22, 2009

(65) Prior Publication Data
US 2010/0174540 A1    Jul. 8, 2010

Related U.S. Application Data

(60) Provisional application No. 60/959,442, filed on Jul. 13, 2007.

(51) Int. Cl.
*H03G 3/00* (2006.01)
*H03G 3/30* (2006.01)
(Continued)

(52) U.S. Cl.
CPC ......... *H03G 3/3005* (2013.01); *G06K 9/6226* (2013.01); *H03G 3/32* (2013.01)

(58) Field of Classification Search
CPC .. G10L 21/02; G06K 9/6226; G06K 9/00496; G06K 9/622; H03G 3/00; H03G 3/001; H03G 3/005; H03G 3/20; H03G 3/32
(Continued)

(56) References Cited

U.S. PATENT DOCUMENTS 4,890,250 A * 12/1989 Levin ............................. 708/3
4,905,286 A *  2/1990 Sedgwick et al. ............ 704/233
(Continued)

FOREIGN PATENT DOCUMENTS

RU    2237965    10/2004
TW    299435     3/1997
(Continued)

OTHER PUBLICATIONS

EPO Intl Searching Authority, Notification of Transmittal of the International Search Report and the Written Opinion of the International Searching Authority, or the Declaration, mailed Nov. 3, 2009.

(Continued)

*Primary Examiner* — Xu Mei
(74) *Attorney, Agent, or Firm* — David B. Walker; Barcelo, Harrison & Walker, LLP

(57) ABSTRACT

Methods, media and apparatus for smoothing a time-varying level of a signal. A method includes estimating a time-varying probability density of a short-term level of the signal and smoothing a level of the signal by using the probability density. The signal may be an audio signal. The short-term level and the smoothed level may be time series, each having current and previous time indices. Here, before the smoothing, computing a probability of the smoothed level at the previous time index may occur. Before the smoothing, calculating smoothing parameters using the probability density may occur. Calculating the smoothing parameters may include calculating the smoothing parameters using the smoothed level at the previous time index, the short-term level at the current time index and the probability of the smoothed level at the previous time index. Calculating the smoothing parameters may include calculating the smooth- (Continued)

ing parameters using breadth of the estimated probability density.

17 Claims, 4 Drawing Sheets

(51) Int. Cl.
*H03G 3/32* (2006.01)
*G06K 9/62* (2006.01)

(58) Field of Classification Search
USPC ............. 381/107, 104; 704/201, 200, 224, 704/E21.002; 84/623, 633
See application file for complete search history.

(56) References Cited

U.S. PATENT DOCUMENTS

| | | | |
|---|---|---|---|
| 5,101,416 A | 3/1992 | Fenton et al. | |
| 5,517,531 A * | 5/1996 | Bond et al. | 375/350 |
| 5,740,048 A * | 4/1998 | Abel et al. | 701/470 |
| 5,744,742 A * | 4/1998 | Lindemann et al. | 84/623 |
| 5,903,872 A * | 5/1999 | Fielder | 704/500 |
| 6,111,183 A | 8/2000 | Lindemann | 84/633 |
| 6,226,409 B1 * | 5/2001 | Cham et al. | 382/228 |
| 6,266,633 B1 * | 7/2001 | Higgins et al. | 704/224 |
| 6,526,378 B1 * | 2/2003 | Tasaki | 704/224 |
| 6,768,979 B1 | 7/2004 | Menendez-Pidal | |
| 6,954,745 B2 * | 10/2005 | Rajan | 706/22 |
| 7,203,371 B2 * | 4/2007 | Simard et al. | 382/239 |
| 7,212,652 B1 * | 5/2007 | Graham et al. | 382/103 |
| 7,215,721 B2 | 5/2007 | Hietala et al. | |
| 7,219,034 B2 * | 5/2007 | McGee et al. | 702/180 |
| 7,343,284 B1 * | 3/2008 | Gazor et al. | 704/226 |
| 7,552,030 B2 * | 6/2009 | Guralnik et al. | 702/188 |
| 7,983,490 B1 * | 7/2011 | Minter | 382/224 |
| 8,005,238 B2 * | 8/2011 | Tashev et al. | 381/94.2 |
| 2002/0059065 A1 * | 5/2002 | Rajan | 704/226 |
| 2002/0196510 A1 * | 12/2002 | Hietala et al. | 359/189 |
| 2004/0049384 A1 * | 3/2004 | Subramaniam et al. | 704/230 |
| 2004/0170308 A1 * | 9/2004 | Belykh et al. | 382/128 |
| 2004/0225498 A1 * | 11/2004 | Rifkin | 704/250 |
| 2005/0203744 A1 * | 9/2005 | Tamura | 704/265 |
| 2005/0278171 A1 * | 12/2005 | Suppappola et al. | 704/227 |
| 2006/0116920 A1 * | 6/2006 | Shan | 705/10 |
| 2006/0274620 A1 * | 12/2006 | Haddad | 369/53.31 |
| 2007/0076783 A1 * | 4/2007 | Dishman et al. | 375/136 |
| 2009/0192743 A1 * | 7/2009 | Ikeda et al. | 702/83 |
| 2010/0217572 A1 * | 8/2010 | Guhmann et al. | 703/2 |

FOREIGN PATENT DOCUMENTS

| | | |
|---|---|---|
| TW | 334557 | 6/1998 |
| WO | 92/15150 A | 9/1992 |
| WO | 2004/111994 A2 | 12/2004 |

OTHER PUBLICATIONS

Seefeldt, Alan, "A New Objective Measure of Perceived Loudness", Audio Engineering Society Convention Paper 6236, San Francisco, CA Oct. 28, 2004.

PCT International Search Report of International Application TW Patent Application No. 97126352 filed on Jul. 11, 2008 in the name of Dolby Laboratories Licensing Corporation.

* cited by examiner

TIME-VARYING AUDIO-SIGNAL LEVEL USING A TIME-VARYING ESTIMATED PROBABILITY DENSITY OF THE LEVEL

TECHNICAL FIELD

The invention relates to audio signal processing. In particular, the invention relates to computing a time-varying measure of the level of an audio signal by smoothing the short-term level of the audio signal, where the parameters of the smoothing process are controlled, at least in part, by a time-varying estimate of the probability density of the short-term level.

REFERENCES AND INCORPORATION BY REFERENCE

Certain techniques for measuring perceived (psychoacoustic) loudness useful in better understanding the present invention are described in published International patent application WO 2004/111994 A2, of Alan Jeffrey Seefeldt et al, published Dec. 23, 2004, entitled "Method, Apparatus and Computer Program for Calculating and Adjusting the Perceived Loudness of an Audio Signal" and in "A New Objective Measure of Perceived Loudness" by Alan Seefeldt et al, Audio Engineering Society Convention Paper 6236, San Francisco, Oct. 28, 2004. Said WO 2004/111994 A2 application and said paper are hereby incorporated by reference in their entirety.

BACKGROUND ART

In audio signal processing, generating a time-varying measure of the audio signal level is often necessary. (Here the term "level" generically refers to a level measure such as peak level, rms level, loudness level, etc.) For example, a loudness meter may display a time-varying measure of an audio signal's perceptual loudness, where this measure is smoothed significantly in order to indicate the average loudness over the past several seconds. In another example, an Automatic Gain Control (AGC) process may compute a highly smoothed time-varying measure of an audio signal's level and then use the resulting measure to generate a slowly varying gain which, when applied to the audio signal, automatically moves the average level of the audio closer to a desired target level.

In these two of many examples, the smoothed level measure may be computed by applying some form of smoothing filter to a short-term level measure. ("Short-term" means computed over a time interval significantly shorter than the interval over which the subsequent smoothing is effective.) For example, one might compute the rms level of the signal or the perceptual loudness level, as described in the WO 2004/111994 A2 application, over an interval of tens of milliseconds to generate the short-term level. The subsequent smoothing of this short-term level might then involve time constants on the order of several seconds. In the following discussion, this time-varying short-term level measure is represented as the signal $L[t]$, and the subsequently smoothed level measure is represented as $\bar{L}[t]$, where t represents the discrete time index.

Many different types of smoothing filters may be applied to $L[t]$ to generate $\bar{L}[t]$. One might use a finite impulse response (FIR) filter or a multi-pole infinite impulse response (IIR) filter. The particular filter employed is not critical. For illustrative purposes one may consider the commonly used fast-attack/slow-release single-pole IIR smoother. With such a filter, the smoothed level measure $\bar{L}[t]$ may be updated according to the equation:

$$\bar{L}[t] = \begin{cases} \alpha_{attack}\bar{L}[t-1] + (1-\alpha_{attack})L[t] & L[t] - \bar{L}[t-1] > 0 \\ \alpha_{release}\bar{L}[t-1] + (1-\alpha_{release})L[t] & L[t] - \bar{L}[t-1] \leq 0 \end{cases} \quad (1)$$

The smoothing coefficients $\alpha_{attack}$ and $\alpha_{release}$ may be chosen such that $\alpha_{attack} < \alpha_{release}$. This means that $\bar{L}[t]$ tracks $L[t]$ more quickly when $L[t]$ is increasing (attack) in comparison to when $L[t]$ is decreasing (release). For an AGC, one might, for example, choose $\alpha_{attack}$ corresponding to a time constant of one second and a $\alpha_{release}$ corresponding to a time constant of four seconds. This way, $\bar{L}[t]$ varies quite slowly over time, and as a result, the corresponding gain which modifies the audio also varies slowly, thereby maintaining the short-term dynamics of the original audio. Problems may arise, however, when using such large time constants. Suppose that such an AGC is operating on the audio of a television set with the intent of maintaining a consistent average level across programming and across various channels. In such a situation, the content of the audio signal being processed by the AGC may abruptly change, when a channel is changed for example, and the associated average level of the audio signal may therefore also abruptly change. With its large time constants, however, the AGC takes a considerable amount of time to converge to a new level and bring the modified level of the processed audio in line with the desired target level. During such adaptation time, a viewer of the television may perceive the level of the audio to be too loud or too soft. As a result, the viewer may quickly reach for the remote control to adjust the volume—only to find himself or herself fighting the AGC as it converges.

The prior art typically solves the problem just described using time constants that adapt based on the relative relationship of the short-term level $L[t]$ to the smoothed level $\bar{L}[t]$. For example, if the short-term level of the signal is significantly greater or less than the smoothed level as defined by some threshold boundaries around the smoothed level, then the smoothing operation switches to faster attack and/or release time constants, respectively, until the short-term level falls back within the threshold boundaries around the smoothed level. Subsequently, the system switches back to the original slower time constants. Equation 1 may be modified to implement this more sophisticated smoothing technique by including four cases rather than two:

$$\bar{L}[t] = \begin{cases} \alpha_{attackFast}\bar{L}[t-1] + \\ \quad (1-\alpha_{attackFast})L[t] & L[t] - \bar{L}[t] > \Delta L_{fast} \\ \alpha_{attack}\bar{L}[t-1] + \\ \quad (1-\alpha_{attack})L[t] & 0 < L[t] - \bar{L}[t] \leq \Delta L_{fast} \\ \alpha_{release}\bar{L}[t-1] + \\ \quad (1-\alpha_{release})L[t] & -\Delta L_{fast} \leq L[t] - \bar{L}[t] \leq 0 \\ \alpha_{releaseFast}\bar{L}[t-1] + \\ \quad (1-\alpha_{releaseFast})L[t] & L[t] - \bar{L}[t] < -\Delta L_{fast} \end{cases} \quad (2)$$

In Equation 2, $\alpha_{attackFast} < \alpha_{attack}$ and $\alpha_{releaseFast} < \alpha_{release}$ meaning that $\alpha_{attackFast}$ and $\alpha_{releaseFast}$ correspond to time constants faster than $\alpha_{attack}$ and $\alpha_{release}$, respectively. If $\alpha_{attack}$ and $\alpha_{release}$ correspond to time constants of 1 and 4 seconds, respectively, then $\alpha_{attackFast}$ and $\alpha_{releaseFast}$ may be chosen, for example, corresponding to time constants of 0.1 and 0.4 seconds, respectively (10 times faster). The fast time constant threshold $\Delta L_{fast}$ must be chosen judiciously so that switching to these faster time constants does not occur too often and result in unwanted instability of the smoothed level $\bar{L}[t]$. If, for example, the level measures $L[t]$ and $\bar{L}[t]$ represent rms level in units of decibels, one might set $\Delta L_{fast}$ at 10 dB, an approximate doubling of perceived loudness.

Though an improvement over the smoothing in Equation 1, the smoothing of Equation 2 may still perform suboptimally for many signals. In general, for any reasonable threshold $\Delta L_{fast}$, signals may exist for which the original desired dynamics of the short-term level $L[t]$ fluctuate outside of the threshold boundaries around the average level $\bar{L}[t]$, thus causing the smoothing process to falsely switch into the fast attack or release mode.

To better understand cases for which the smoothing of Equation 2 performs as desired and for which it performs inadequately, one can imagine the distribution of the short-term level $L[t]$ over time. One may imagine this distribution as a time-varying probability density which predicts the probability of encountering any particular value of short-term level L within an interval of time around the current time index t. The duration of this interval should be commensurate with the slower set of time constants used in the smoothing filter of Equation 2.

Now consider the behavior of this probability density for the television-channel-change example described earlier. Assuming that the dynamic range of the short-term level for a given channel is somewhat limited, the probability density function of the short-term level $L[t]$ takes the form of a fairly narrow hump positioned around the smoothed level $\bar{L}[t]$. When the channel changes, and assuming that the average level of the new channel is significantly higher than the original, the probability density function will begin to change: the original hump decreases as a new hump grows positioned around the higher average level of the new channel.

FIG. 1 depicts such a probability density function at the beginning of the described transition. In this figure, the horizontal axis represents level and the vertical axis represents probability. The solid line represents the probability density of the short-term level at the beginning of the transition. One notes the decreasing hump on the left, representing the decreasing probability associated with the old channel selection, and the increasing hump on the right, representing the increasing probability associated with the new channel selection. At the beginning of the transition, the smoothed level $\bar{L}[t-1]$ still falls within the hump of the old channel selection, while the short-term level $L[r]$ falls within the hump of the new channel. In this diagram, the short-term level $L[t]$ is larger than $\bar{L}[t-1]$ by an amount greater than $\Delta L_{fast}$, and therefore, according to Equation 2, a fast time constant is used to update $\bar{L}[t]$ towards $L[t]$. This is the desired effect: the smoothed level $\bar{L}[t]$ adapts quickly to the higher level of the newly selected channel, traveling quickly across the gap dividing the two humps of the probability density.

FIG. 2 depicts the probability density of the short-term level for a very different audio signal. In this case, original dynamics of the signal are comparatively large, and therefore the hump of the probability density is spread quite wide. Such dynamics may be typical in a high-quality recording of jazz or classical music. Also in FIG. 2, the relationship between $\bar{L}[t-1]$ and $L[t]$ is exactly the same as in FIG. 1, but now both values lie within the main hump of the probability density. Therefore, the switch to a fast time constant is not desired because this relation between $\bar{L}[t-1]$ and $L[t]$ is part of the typical dynamics of the signal. In this case, the smoothing described by Equation 2 is not appropriate.

DISCLOSURE OF THE INVENTION

Herein are taught methods, media and apparatus for smoothing a time-varying level of a signal. A method includes estimating a time-varying probability density of a short-term level of the signal and smoothing a level of the signal by using the probability density. The signal may be an audio signal, while the smoothed level and the estimated probability density may vary over time at approximately the same rate.

The short-term level and the smoothed level may be time series, each having current and previous time indices. Here, before the smoothing, computing a probability of the smoothed level at the previous time index may occur. Before the smoothing, calculating smoothing parameters using the probability density may occur. Calculating the smoothing parameters may include calculating the smoothing parameters using the smoothed level at the previous time index, the short-term level at the current time index and the probability of the smoothed level at the previous time index. Calculating the smoothing parameters may include calculating the smoothing parameters using breadth of the estimated probability density.

Calculating the smoothing parameters may include, when the smoothed level at the previous time index has no greater than a threshold probability, using first attack and release time constants, and otherwise, when the smoothed level at the previous time index has greater than the threshold probability, using attack and release time constants, one of which is slower than its first-time-constants correspondent. Both of the used attack and release time constants may be slower than their corresponding first time constants.

The threshold probability may be variable. The variable threshold probability may be a function of the estimated probability density.

Smoothing may include smoothing the short-term level by using the probability density.

Estimating the probability density may include fitting a parametric representation to past values of the short-term level. The fitting may include fitting a Gaussian mixture model to the past values of the short-term level. Estimating the probability density may include computing a histogram of past values of the short-term level.

A computer-readable memory may contain a computer program for performing any one of the methods described herein.

A computer system may include a CPU, such a memory and a bus communicatively coupling the CPU and the memory.

An audio-signal-level smoother may include a short-term-level computer for computing a short-term level of an audio signal, a level smoother for smoothing level of the audio signal using smoothing parameters, a probability-density estimator for estimating a probability density of the audio signal, a probability computer for computing a probability of a delayed smoothed level, a smoothing-parameters calculator for calculating the smoothing parameters and a delay for delaying the smoothed level.

The probability-density estimator may include a probability-density estimator for estimating a probability density using a time series of the short-term level of the audio signal. The probability computer may include a probability computer for computing the probability using the estimated probability density and the delayed smoothed level. The smoothing-parameters calculator may include a smoothing-parameters calculator for calculating smoothing parameters using the probability, the delayed smoothed level and the short-term level. The probability computer may include a probability computer for computing the probability using the estimated probability density and the delayed smoothed level, and the smoothing-parameters calculator may include a smoothing-parameters calculator for calculating smoothing parameters using the probability, the delayed smoothed level and the short-term level.

The level smoother may include a level smoother for smoothing the short-term level of the audio signal.

The probability-density estimator may include a fitter for fitting a parametric representation to past values of the short-term level. The parametric-representation fitter may include a fitter for fitting a Gaussian mixture model to the past values of the short-term level. The probability-density estimator may include a histogram computer for computing a histogram of past values of the short-term level.

Another method for smoothing a time-varying level of a signal may include receiving a signal having a short-term level and smoothing the time-varying level, where the short-term level and the smoothed time-varying level are time series, each having current and previous time indices, and the smoothing may include using slow time constants where the difference between the smoothed short-term level at the previous time index and the short-term level at the current time index exceeds a threshold directing the use of fast time constants.

The various features of the present invention and its preferred embodiments may be better understood by referring to the following discussion and the accompanying drawings in which like reference numerals refer to like elements.

BEST MODE FOR CARRYING OUT THE INVENTION

Figure 3:
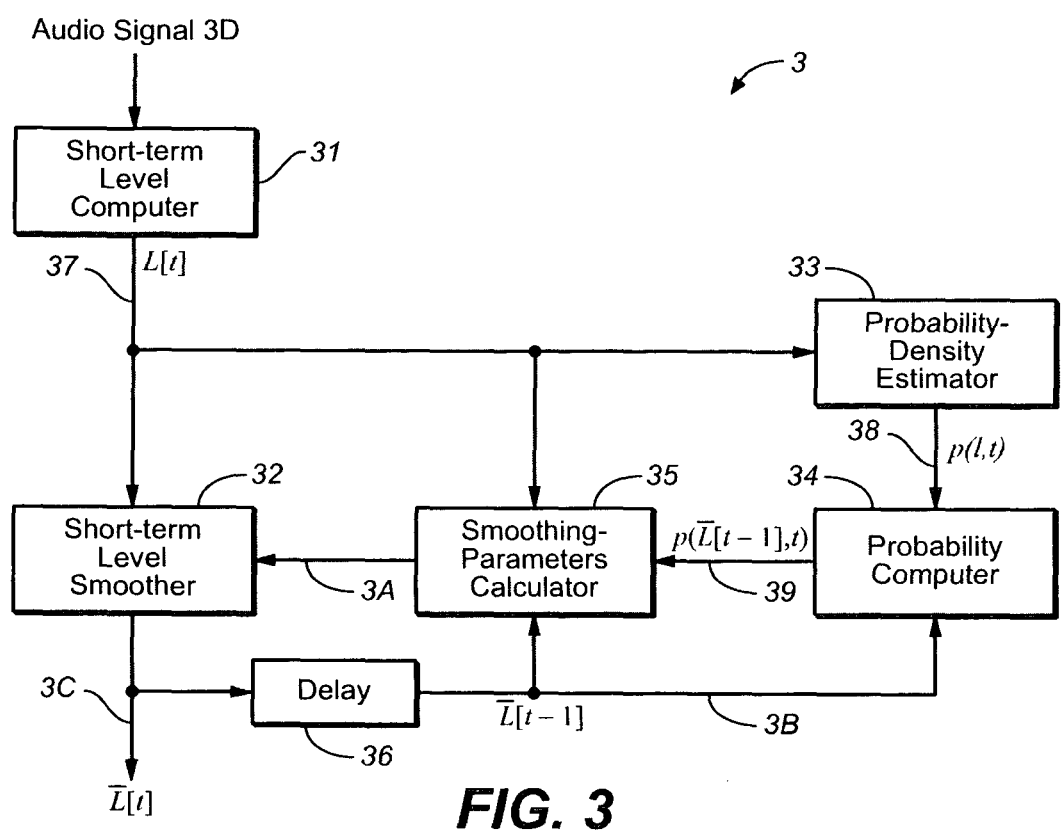
FIG. 3 depicts an overview block diagram of an embodiment of the invention.

FIG. 3 is a block diagram of a smoothed-level generator 3, according to one embodiment of the invention.

The smoothed-level generator 3 includes a short-term-level computer 31, a short-term level smoother 32, a probability-density estimator 33, a probability computer 34, a smoothing-parameters calculator 35 and a delay 36. The short-term-level computer 31 receives an audio signal 3D as input and produces a short-term level $L[t]$ 37 as its output. The probability-density estimator 33 receives the short-term level $L[t]$ 37 as input and produces an estimated probability density $p(l,t)$ 38 as its output. The probability computer 34 receives the estimated probability density $p(l,t)$ 38 and the delayed smoothed level measure $\bar{L}[t-1]$ 3C as its input and produces the probability $p(\bar{L}[t-1],t)$ 39 as its output. The smoothing-parameters calculator 35 receives the probability $p(\bar{L}[t-1],t)$ 39 as its input, as well as the delayed smoothed short-term level 3B and the short-term level $L[t]$ 37, and produces the smoothing parameters 3A as its output. The short-term level smoother 32 receives the smoothing parameters 3A and the short-term level $L[t]$ 37 as its input and produces the smoothed level measure $\bar{L}[t]$ 3C as its output. Finally, the delay 36 receives and delays the smoothed level measure $\bar{L}[t]$ 3C.

Of course, the smoothed-level generator 3 may be implemented in whole or in part as a general-purpose computer including programmed memory, as application-specific circuitry, as a programmable gate array, etc.

The operation of the smoothed-level generator 3 according to one embodiment is described next.

The smoothed-level generator 3 generates a smoothed level estimate $\bar{L}[t]$ by smoothing a short-term level estimate $L[t]$, controlled, at least in part, by information derived from a time-varying probability density estimate of the short-term level $L[t]$. The resulting smoothed level estimate $\bar{L}[t]$ is useful, for example, as a value displayed by a real-time loudness meter or for use in the control path in an audio dynamics processor such as an AGC.

Figure 5:
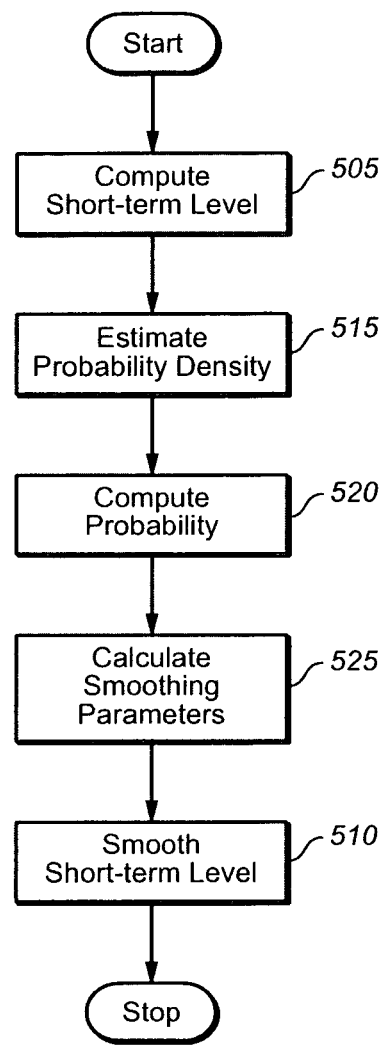
FIG. 5 is a flowchart of the operation of the smoothed-level generator, according to one embodiment of the invention.

FIG. 5 is a flowchart of the operation of the smoothed-level generator 3, according to one embodiment of the invention. First, the short-term level $L[t]$ of an audio signal is computed, step 505. This short-term level is smoothed, step 510, generating the smoothed level measure $\bar{L}[t]$.

Concurrently, from the short-term level $L[t]$, a time-varying estimate of the probability density of the short-term level is updated, step 515. This probability density estimate, $p(l,t)$, returns a probability between zero and one for an input level $l$. The time index $t$ indicates that this function changes over time as the probability density estimator 33 (FIG. 3) receives new values of the short-term level $L[t]$. Ideally, the time interval over which the probability density estimator 33 considers values of $L[t]$ for creating the estimate $p(l,t)$ should be commensurate with the time constants from which the smoother 32 generates $\bar{L}[t]$. As a result, $\bar{L}[t]$ and $p(l,t)$ vary over time at approximately the same rate.

A probability of the smoothed level measure from the previous time index, $p(\bar{L}[t-1],t)$, is computed, step 520, by feeding the density estimate $p(l,t)$ with the level value $\bar{L}[t-1]$. This probability value $p(\bar{L}[t-1],t)$ represents information about the relationship between $\bar{L}[t-1]$ and many values of the short-term level around the time index $t$—not only the relationship between $\bar{L}[t'1]$ and the current short-term level $L[t]$. For example, if $p(\bar{L}[t-1],t)$ is high, this indicates that $\bar{L}[t-1]$ is similar to many values of the short-term level in the recent past. Conversely, if $p(\bar{L}[t-1],t)$ is low, then $\bar{L}[t-1]$ is different from most values of the short-term level in the recent past.

Finally, the probability value $p(\bar{L}[t-1],t)$, as well as the current short-term level $L[t]$ and the previous smoothed level measure $\bar{L}[t-1]$, feed into the smoothing-parameter calculator 35 (FIG. 3) that uses these values to select the smoothing parameters for generating the current smoothed level measure $\bar{L}[t]$, step 525.

Although FIG. 3 depicts $p(\bar{L}[t-1],t)$ controlling the smoothing parameters, other information derived from the density estimate $p(l,t)$ could be employed. For example, the smoothing-parameters calculator 35 may use a measure of the breadth of the density estimate, an indicator of the dynamic range of the audio signal.

Returning to the illustrated use of p($\overline{L}$[t−1],t), generally, when the density estimate p(l,t) estimates the previous smoothed value $\overline{L}$[t−1] to have low probability, then fast time constants should update $\overline{L}$[t]. If the probability of $\overline{L}$[t−1] is relatively high, then normal slower time constants should be used. This way, if the majority of the short-term level values have moved far away from the previous smoothed value $\overline{L}$[t−1], then $\overline{L}$[t] will move more rapidly towards such values. If $\overline{L}$[t−1] is already near the majority of the short-term level values, then slower movement is appropriate.

Figure 1:
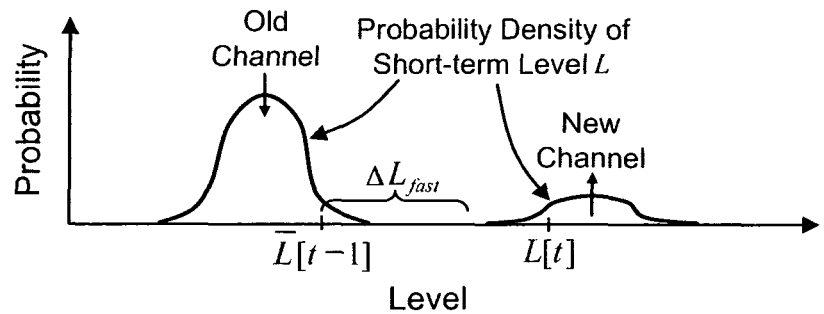
FIG. 1 depicts the probability density of the short-term level of an audio signal for which switching to a fast-smoothing time constant is appropriate.
Figure 2:
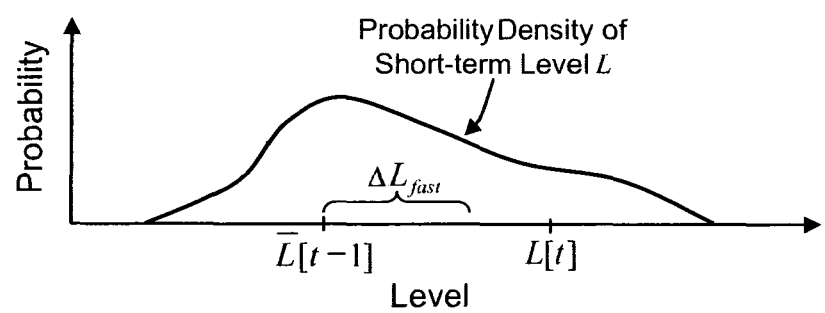
FIG. 2 depicts the probability density of the short-term level of an audio signal for which switching to a fast-smoothing time constant is inappropriate.
Figure 4:
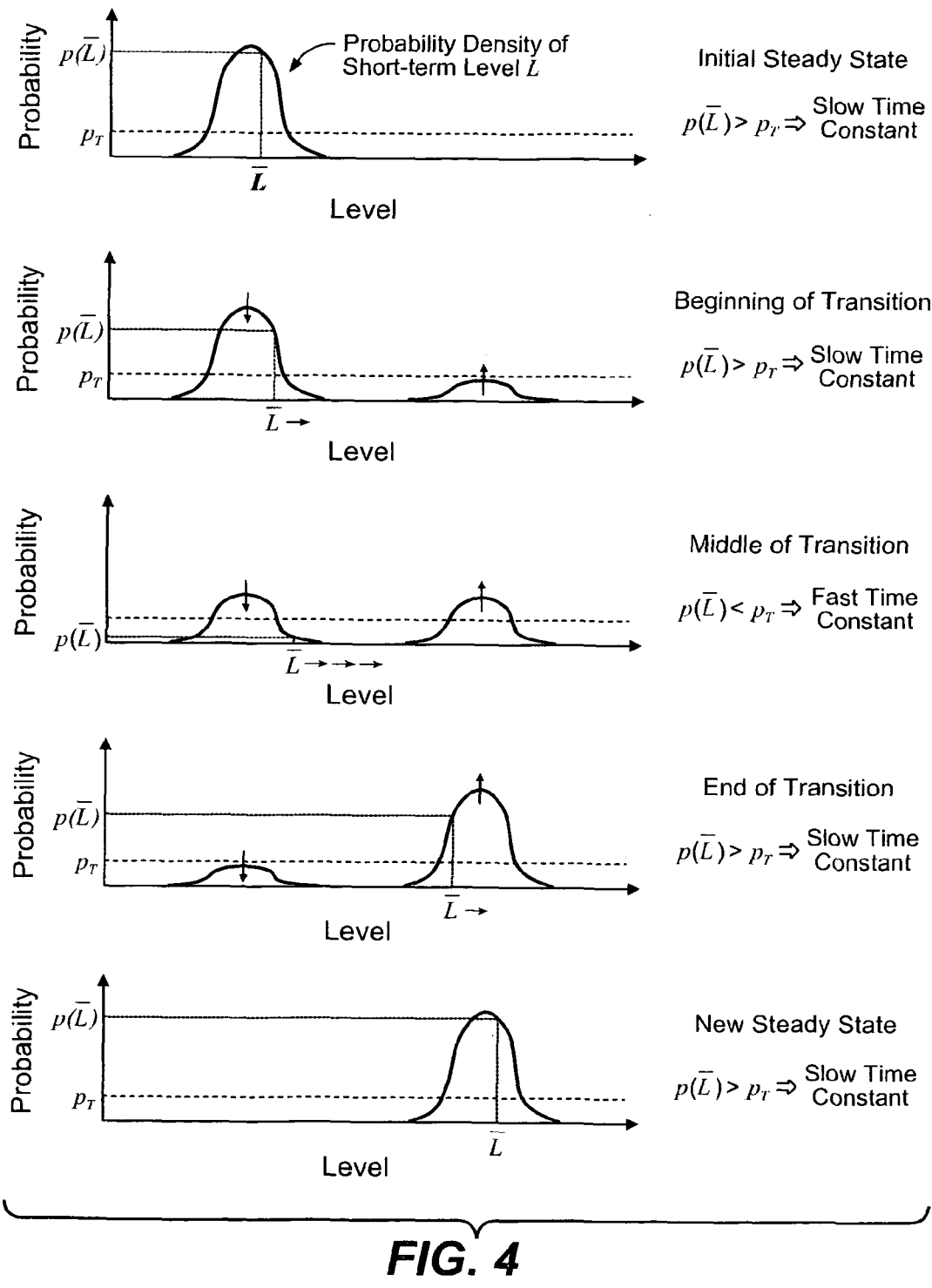
FIG. 4 depicts the operation of an embodiment of the invention on an audio signal that switches between sources of significantly different levels.

With reference to FIG. 2, an embodiment of the invention prevents the undesired switch to faster time constants because $\overline{L}$[t−1] lies within an area of high probability even though the short-term level L[t] is relatively far away. For the channel-change example in FIG. 1, it is worthwhile to examine in more detail how this strategy still produces the desired fast adaptation. To assist, FIG. 4 depicts the transition between the two channels in five stages. A simple time-constant control strategy assumes that when p($\overline{L}$[t−1],t) is greater than some threshold $p_T$, slow time constants are used to update $\overline{L}$[t−1]. When p($\overline{L}$[t−1],t) is less than this threshold $p_T$, fast time constants are used. (The time index has been removed from the notation in the figure to simplify the expressions.)

The first stage of FIG. 4, the initial steady state, depicts conditions just before selecting the second, louder channel. The probability density of the short-term level is distributed closely around the average level of the first channel. The smoothed level $\overline{L}$ lies within the main hump of this density. Therefore the probability of $\overline{L}$, p($\overline{L}$), is greater than the threshold $p_T$, and slow time constants are used to update $\overline{L}$.

The second stage, the beginning of transition, represents the state of the system just after the audio has switched to the louder second channel. In this stage, the large hump of the probability density positioned around the average level of the first channel shrinks, and a new hump positioned around the average level of the louder second channel grows. The smoothed level $\overline{L}$ has begun to move right towards the average level of the second channel. Its probability, however, is still greater than $p_T$, and therefore the slower time constants are still employed.

In the third stage, the middle of transition, the first hump of the probability density has continued to shrink, and the second hump has continued to grow. The smoothed level $\overline{L}$ has continued growing to the right towards the second channel, but now its probability falls below the threshold $p_T$. ($\overline{L}$ has moved into the low-probability gap between the two humps.) At this point, fast time constants are used to update $\overline{L}$, causing it to rapidly move across the gap towards the hump of the second channel.

In the fourth stage, the end of transition, $\overline{L}$ has moved into the main hump of the second channel, and its probability is again greater than $p_T$. A switch back to the slower time constants now occurs.

Finally, in the fifth stage, the new steady state, the smoothed level $\overline{L}$ has settled at the average level of the second channel; and slow time constants continue to be used.

By using information derived from the time-varying probability density estimate p(l,t), this invention embodiment adapts the time constants for smoothing an audio signal level measure in a way that responds quickly during true periods of transition yet remains stable for previously problematic signals.

An example of a specific embodiment of the invention is now described in detail. In this embodiment, the smoothing generating $\overline{L}$[t] from L[t] may be expressed as a one-pole filter with a time-varying coefficient α[t]:

$$\overline{L}[t] = \alpha[t]\overline{L}[t-1] + (1-\alpha[t])L[t] \quad (3)$$

This smoothing is adapted by varying the coefficient α[t] as a function of the probability density estimate p(l,t). The derivation of this density estimate p(l,t) from the short-term level L[t] is first described. Then control of the coefficient α[t] is described.

Estimation of the Probability Density

The probability density estimate p(l,t) captures the behavior of the short-term level L[t] over a time interval extending into the recent past from the current time index t. To do this, the estimator 33 (FIG. 3) maintains a buffer (not shown) containing the past T values of the short-term level L[t]. (The length T of this buffer may be chosen according to the desired application. For the AGC example discussed earlier, one may, for example, set the length of the buffer equal to four seconds.)

From this buffer, one might generate an estimate of the probability density in any number of ways. For example, one might fit a parametric representation such as a Gaussian mixture model to the data in the buffer. Another technique computes a histogram of the buffered data. Each value in the buffer is assigned to a discrete bin. The density function p(l,t) is computed by first finding the bin into which the value l falls and then computing the probability as the number of points in the data buffer assigned to this bin divided by the total number of points in the data buffer. The bins of the histogram may be defined to lie between some minimum level $L_{min}$ and maximum level $L_{max}$ with a spacing of $\Delta L_{bin}$. For example, if the level is represented in units of dB, one might set $L_{min}$=1 dB, $L_{max}$=120 dB, and $\Delta L_{bin}$=1 dB, to yield a histogram with 120 bins. The total number of bins B may be expressed generally as:

$$B = \text{round}\left(\frac{L_{max} - L_{min}}{\Delta L_{bin}}\right) + 1 \quad (4)$$

At each time instant t, the number of samples in the length T data buffer falling into each bin of the histogram is counted. $H_t[b]$, b=1 . . . B, is the histogram bins, and the bin b to which a level value l is assigned may be computed according to the mapping function:

$$\text{LevelToBin}(l) = \begin{cases} B & l \geq L_{max} \\ \text{round}\left(\frac{l - L_{min}}{\Delta L_{bin}}\right) & L_{min} < l < L_{max} \\ 1 & l < L_{min} \end{cases} \quad (5)$$

Algorithmically, the computation of the histogram $H_t[b]$ at every time t occurs according to the following pseudo code:

```
for b = 1 to B,
    H_t[b] = 0
end
for τ = 0 to T−1,
    b = LevelToBin(L[t − τ])
    H_t[b] = H_t[b] + 1
end
```

The probability density estimate p(l,t) is then given by the histogram at the bin to which l is assigned divided by the total number of data points in the buffer:

$$p(l, t) = \frac{H_t[LevelToBin(l)]}{T} \quad (6)$$

The result is an estimated probability density p(l,t) that is not a continuous function of the input level l but rather a function that "stair-steps" at an interval of $\Delta L_{bin}$. If the histogram spacing $\Delta L_{bin}$ is small enough, however, the probability density estimate is smooth enough for practical purposes.

Calculation of the Smoothing Filter Coefficient

Calculation of the adaptive filter coefficient α[t] is now described. Under normal conditions, when the probability of $\overline{L}$[t−1] is relatively high, normal attack and release time constants (as in Equation 1) are used. When the probability of $\overline{L}$[t−1] is low, faster attack and release time constants are used.

To smoothly interpolate between normal and fast time constants, a control signal β[t] ranging between zero and one is generated based on the probability of $\overline{L}$[t−1] computed from the density estimate p(l,t):

$$\beta(t) = \begin{cases} 1 & p(\overline{L}[t-1], t) > p_T \\ \frac{p(\overline{L}[t-1], t)}{p_T} & p(\overline{L}[t-1], t) \leq p_T \end{cases} \quad (7)$$

If p($\overline{L}$[t−1],t) is greater than a threshold $p_T$, then the control signal β[t] is equal to one. As p($\overline{L}$[t−1],t) falls below $p_T$, the control signal β[t] falls to zero. Finally, the smoothing filter coefficient α[t] is computed by interpolating between normal and fast attack and release coefficients based on the control signal β[t].

$$\alpha[t] = \begin{cases} \beta(t)\alpha_{attack} + (1-\beta[t])\alpha_{attackFast} & L[t] - \overline{L}[t-1] > 0 \\ \beta(t)\alpha_{release} + (1-\beta[t])\alpha_{releaseFast} & L[t] - \overline{L}[t-1] \leq 0 \end{cases} \quad (8)$$

When β[t] is equal to zero ($\overline{L}$[t−1] lies in an area of low probability), the fast attack and release coefficients are used. When β[t] is equal to one ($\overline{L}$[t−1] lies in an area of high probability), then the normal attack and release coefficients are used.

For the implementation of an AGC, the values of $\alpha_{attack}$, $\alpha_{attackFast}$, $\alpha_{release}$, and $\alpha_{releaseFast}$, may be set corresponding to time constants of 1, 0.1, 4, and 0.4 seconds, respectively. The value of the probability threshold $p_T$ may be set to a fixed value of 0.075.

Though this embodiment uses a fixed value of the threshold $p_T$ it may also be advantageous in certain applications to make $p_T$ a variable threshold which changes, for example, as a function of some measure of the density estimate p(l,t). For example, $p_T$ might vary with the maximum of p(l,t) across level l.

This specification incorporates by reference all publications and patent applications mentioned herein, to the same extent if the specification had specifically and individually incorporated by reference each such individual publication or patent application.

As this invention may be embodied in several forms without departing from the spirit of essential characteristics thereof, the present embodiment is therefore illustrative and not restrictive. Changes that fall within the metes and bounds of the claims, or the equivalence of such metes and bounds thereof are therefore intended to be embraced by the claims.

The invention claimed is:

1. A method for smoothing a time-varying level of a signal, the method comprising:
   estimating a time-varying probability density of the time-varying level of the signal;
   computing a probability of a prior smoothed time-varying level using the time-varying probability density estimate;
   adapting a smoothing filter in response to the probability; and
   applying the adapted smoothing filter to the time-varying level to generate the smoothed time-varying level.

2. The method of claim 1 that comprises adapting time constants of the smoothing filtering to be commensurate with the rate of variation of the estimated probability density.

3. The method of claim 1 wherein the time-varying level and the smoothed time-varying level are time series, each having current and previous time indices, and wherein the method comprises:
   computing the probability of smoothed time-varying level at the previous time index;
   adapting the smoothing filter in response to the probability of the smoothed time-varying level at the previous time index; and
   applying the adapted smoothing filter to the time-varying level at the current time index.

4. The method of claim 3 wherein the method comprises adapting the smoothing filter in response to:
   the smoothed time-varying level at the previous time index, the time-varying level at the current time index and the probability of the smoothed time-varying level at the previous time index.

5. The method of claim 4 that comprises adapting attack and release time constants of the smoothing filter such that:
   the attack constant is equal to a first attack value and the release constant is equal to a first release value when the computed probability of the smoothed time-varying level at the previous time index is less than or equal to a threshold probability; and
   the attack constant is equal to a second attack value and the release constant is equal to a second release value when the computed probability of the smoothed time-varying level at the previous time index is greater than the threshold probability, wherein either the second attack value is greater than the first attack value or the second release value is greater than the first release value.

6. The method of claim 5 that comprises adapting the threshold probability in response to the estimated probability density.

7. The method of claim 1 that comprises adapting the smoothing filter in response to the width of the time-varying probability density.

8. The method of claim 1 that adapts the smoothing filter by modifying time constants of the smoothing filter in response to the probability, wherein faster time constants are used when the probability is lower and slower time constants are used when the probability is higher.

9. The method of claim 1 that comprises estimating the probability density by fitting a parametric representation to past values of the time-varying level.

10. The method of claim 1 that comprises estimating the probability density by computing a histogram of past values of the time-varying level.

11. An apparatus for smoothing a time-varying level of an audio signal, wherein the apparatus comprises:
    an input terminal for receiving the audio signal;
    a short-term-level computer coupled to the input terminal for computing a short-term level of the audio signal;
    a level smoother coupled to an output of the short-term level computer for smoothing the short-term level of the audio signal using smoothing parameters;
    a probability-density estimator coupled to the output of the short-term-level computer for estimating a probability density of the short-term level;
    a delay coupled to an output of the level smoother for delaying the smoothed short-term-level of the audio signal;
    a probability computer coupled to an output of the probability-density estimator and to an output of the delay for computing a probability of the delayed smoothed short-term level; and
    a smoothing-parameters calculator coupled to the output of the short-term level computer, coupled to an output of the probability computer, and coupled to the output of the delay for calculating the smoothing parameters, wherein the level smoother is also coupled to an output of the smoothing-parameters calculator.

12. The apparatus of claim 11 wherein the probability-density estimator estimates the probability density using a time series of the short-term level of the audio signal.

13. The apparatus of claim 12 wherein
    the probability computer computes the probability using the estimated probability density and the delayed smoothed short-term level; and
    the smoothing-parameters calculator calculates the smoothing parameters using the probability, the delayed smoothed short-term level and the short-term level.

14. The apparatus of claim 11 wherein the probability computer computes the probability using the estimated probability density and the delayed smoothed short-term level.

15. The apparatus of claim 11 wherein the smoothing-parameters calculator calculates the smoothing parameters using the probability, the delayed smoothed short-term level and the short-term level.

16. The apparatus of claim 11 wherein the probability-density estimator fits a parametric representation to past values of the short-term level.

17. The apparatus of claim 11 wherein the probability-density estimator computes a histogram of past values of the short-term level.

* * * * *